United States Patent
Zeller

(10) Patent No.: US 8,378,733 B2
(45) Date of Patent: Feb. 19, 2013

(54) HARMONIC REJECTION MIXER

(75) Inventor: Sebastian Zeller, Grassbrunn (DE)

(73) Assignee: STMicroelectronics Design & Application GmbH, Grassbrunn (DE)

( * ) Notice: Subject to any disclaimer, the term of this patent is extended or adjusted under 35 U.S.C. 154(b) by 543 days.

(21) Appl. No.: 12/609,346

(22) Filed: Oct. 30, 2009

(65) Prior Publication Data

US 2011/0102051 A1    May 5, 2011

(51) Int. Cl.
  *G06F 7/44*  (2006.01)
(52) U.S. Cl. ............ 327/359; 327/355; 455/323
(58) Field of Classification Search .......... 327/355–361; 455/323, 326
See application file for complete search history.

(56) References Cited

U.S. PATENT DOCUMENTS

| | | | | |
|---|---|---|---|---|
| 6,871,057 | B2 * | 3/2005 | Ugajin et al. | 455/323 |
| 7,190,943 | B2 * | 3/2007 | Davis | 455/313 |
| 7,509,110 | B2 * | 3/2009 | Hayashi et al. | 455/302 |

* cited by examiner

*Primary Examiner* — Dinh T. Le
(74) *Attorney, Agent, or Firm* — Seed IP Law Group PLLC

(57) ABSTRACT

A harmonic rejection mixer includes a differential in-phase signal path and a differential quadrature signal path, a shared differential transconductor for generating a shared transconductor output signal from a mixer input signal, a first selective mixing circuit disposed in the differential quadrature signal path and coupled to the shared differential transconductor, and a second selective mixing circuit disposed in the differential in-phase signal path and coupled to the shared differential transconductor, the first selective mixing circuit is controlled by a first selective control signal and the second selective mixing circuit is controlled by a second selective control signal to selectively supply the shared transconductor output signal to the differential quadrature signal path and the differential in-phase signal path, respectively.

22 Claims, 3 Drawing Sheets

HARMONIC REJECTION MIXER

BACKGROUND

1. Technical Field

The present disclosure is directed to a harmonic rejection mixer and to a mixing stage of a harmonic rejection mixer.

2. Description of the Related Art

Electronic mixers are devices used for translating a signal from one frequency, commonly a radio frequency $f_{RF}$, to another frequency, commonly an intermediate frequency $f_{IF}$ or the baseband. Such a translation from the radio frequency $f_{RF}$ to the intermediate frequency $f_{IF}$ is commonly carried out in the receiver of a communication system, such as a radio system. In the sender of a communication system, the according translation from the baseband or the intermediate frequency $f_{IF}$ to the radio frequency $f_{RF}$ is also carried out by an electronic mixer. The mixing operation is accomplished by multiplying the radio frequency signal with a local oscillation signal having a local oscillation frequency $f_{LO}$, wherein $f_{IF}=f_{RF}-f_{LO}$ for example ($f_{IF}=f_{LO}-f_{RF}$ is also possible). For the sake of a simple implementation, the local oscillation signal is commonly a square wave signal. However, the spectrum of a square wave signal includes spectral components at the fundamental frequency, i.e., here $f_{LO}$, and at odd multiples of the fundamental frequency. Accordingly, unwanted spectral components of the original signal are mixed into the intermediate frequency signal in the course of the multiplication.

A previous approach to deal with this issue are so-called harmonic rejection mixers, an example of which is shown in FIG. 1. The harmonic rejection mixer of FIG. 1 has two input terminals 102 and 104 for receiving a differential mixer input signal. After the mixing operation, a differential output signal is provided at the mixer output terminals 106 and 108 for further processing. The mixer 1 includes three differential transconductors 2, 3 and 4, each of which includes a current bias source and two MOSFET transistors, such that the mixer input voltage signal is translated into three differential transconductor output current signals. The differential output current signals of the differential transconductors 2 and 4 can be written as $i_{out,2}=i_{out,4}=u_{in,1}*g_m$, with $u_{in,1}$ being the mixer input signal between input terminals 102 and 104 and $g_m$ being the transconductance of the differential transconductors 2 and 4, respectively. The bias current source and the width-to-length ratios of the transistors of the differential transconductor 3 are chosen in such a way that $i_{out,3}=\sqrt{2}*u_{in,1}*g_m$.

The three differential transconductor output signals $i_{out,2}$, $i_{out,3}$ and $i_{out,4}$ are then multiplied with square wave signals in the mixing circuits 5, 6 and 7, respectively. For this purpose, a first square wave signal is supplied to the terminals 502 and 504 of the mixing circuit 5, a second square wave signal is supplied to the terminals 602 and 604 of the mixing circuit 6, and a third square wave signal is supplied to the terminals 702 and 704 of the mixing circuit 7. All of the square wave signals are periodic and have the same local oscillation frequency $f_{LO}$. Hence, no shifting of the signals over time with respect to each other takes place. Accordingly, it is sufficient to describe the behavior of the mixing circuits during one wavelength of the square wave signals, as it is repeated periodically. A wavelength of the square wave signals is hereinafter referred to as ranging from 0° to 360°, which is common nomenclature for periodic signals.

The operation of such a mixing circuit is exemplarily described with respect to the mixing circuit 6. The mixing circuit 6 includes four transistors 606, 608, 610 and 612. For illustrative purposes, it is assumed that each of these transistors is in a conductive state when a logical "1" signal is applied to the control terminal, i.e., to its gate terminal. When a logical "0" signal is applied to the control terminal, the respective transistor is in a non-conducting state. It is further assumed that the signal supplied to the terminal 602 is at a logical "1" state for the first half of the second square wave signal and is at a logical "0" state for the second half of the wavelength of the second square wave signal. In contrast thereto, the signal supplied to the terminal 604 is at a logical "0" state for the first half of the wavelength and at a logical "1" state for the second half of the second square wave signal. In other words, the differential signal between the terminals 602 and 604 is a square wave signal, denoted as $sq_2(ö)$, which is +1 for the first half of the wavelength and −1 for the second half of the wavelength, i.e., +1 for ö between 0° and 180° and −1 for ö between 180° and 360°. The signal supplied to the terminal 602 can be seen as a square wave signal which starts at an initial point in time $t_0$ at a logical "1" state for half a wavelength, then goes down to a logical "0" state for another half a wavelength, goes up to the logical "1" state for yet another half a wavelength, etc. This signal may be referred to as the fundamental square wave signal hereinafter. The signal supplied to the terminal 604 may then be seen as a version of the fundamental square wave signal shifted by half a wavelength, i.e., shifted by 180°. Through the switching structure of mixing circuit 6, the output signal of the mixing circuit 6, i.e., $i_{out,6}$, results to be $\sqrt{2}*u_{in,1}*g_m*sq_6(ö)$, where $sq_6(ö)$ corresponds to sgn(sin(ö)).

Analogously, the output signal of mixing circuit 5, i.e., $i_{out,5}$, is $u_{in,1}*g_m*sq_5(ö)$. Therein, $sq_5(ö)$ is sgn(sin(ö−45°)). This corresponds to the fundamental square wave signal shifted by 45° being supplied to terminal 504 and the fundamental square wave signal shifted by 225° being supplied to terminal 502. Further analogously, the output signal of the mixing circuit 7, i.e., $i_{out,7}$, is $u_{in,1}*g_m*sq_7(ö)$. Therein, $sq_7(ö)$ is sgn(sin(ö−315°)), which corresponds to the fundamental square wave signal shifted by 315° being supplied to terminal 702 and the fundamental square wave signal shifted by 135° being supplied to terminal 704.

With the current signals $i_{out,5}$, $i_{out,6}$ and $i_{out,7}$ adding up to yield the mixer output signal $i_{out,1}$ between the mixer output terminals 106 and 108, $i_{out,1}$ has the following values during a wavelength: $\sqrt{2}*u_{in,1}*g_m$ between 0° and 45°, $(\sqrt{2}+2)*u_{in,1}*g_m$ between 45° and 135°, $\sqrt{2}*u_{in,1}*g_m$ between 135° and 180°, $(-\sqrt{2})*u_{in,1}*g_m$ between 180° and 225°, $-(\sqrt{2}+2)*u_{in,1}*g_m$ between 225° and 315°, and $(-\sqrt{2})*u_{in,1}*g_m$ between 315° and 360°.

As is apparent, the signal $i_{out,1}$ is a multiplication of the input signal in the current domain, i.e., $u_{in,1}*g_m$, with a sin-signal after a sample and hold operation. In other words, the resulting multiplication signal described above is a sin-signal with the local oscillation frequency $f_{LO}$ sampled eight times per wavelength, with the sampling value being held until the next sampling time. Accordingly, the sampling frequency is eight times the local oscillation frequency $f_{LO}$.

In signal theory, a signal has to be sampled with twice its highest frequency in order to be reproducible from the sample values. For a regular sig-signal, this threshold frequency, also called Nyquist frequency, would be twice the frequency of the sin-signal. Accordingly, in the example given above, one would call the sign signal to be four times oversampled. A basic property of such an N-time oversampled sin-signal is that the spectrum of the resulting sample and hold signal only includes harmonics at $f_{LO}*2N-1$, $2N+1$, $4N-1$, $4N+1$, etc. Accordingly, the harmonic rejection mixer described above suppresses the third, fifth, eleventh, thirteenth, ... harmonics of the local oscillation frequency, such that substantially less undesired radio frequency signals are mixed into the intermediate frequency band, as compared to a mixer using solely one square wave. Accordingly, substantial harmonic rejection can be achieved.

However, in modern, low power applications, the performance of harmonic rejection mixers based on the above described structure is no longer sufficient.

Accordingly, it would be beneficial to provide a harmonic rejection mixer with reduced power dissipation at the same transconductance level and harmonic rejection level.

BRIEF SUMMARY

According to a first aspect of the disclosure, a harmonic rejection mixer is provided, that includes a differential in-phase signal path and a differential quadrature signal path, a shared differential transconductor for generating a shared transconductor output signal from a mixer input signal, a first selective mixing circuit disposed in the differential quadrature signal path and coupled to the shared differential transconductor, and a second selective mixing circuit disposed in the differential in-phase signal path and coupled to the shared differential transconductor, wherein the first selective mixing circuit is controlled by a first selective control signal and the second selective mixing circuit is controlled by a second selective control signal to selectively supply the shared transconductor output signal to the differential quadrature signal path and the differential in-phase signal path, respectively.

Through the sharing of a differential transconductor between the in-phase signal path and the quadrature signal path, a number of advantages can be achieved. The selective supply of the shared transconductor output signal allows for an easy implementation of complex resulting local oscillation signals for mixing purposes without the need to generate these complex local oscillation wave forms through current cancelling. Accordingly, as all of the shared transconductor output current may be used in either the in-phase signal path or the quadrature signal path, no current is "wasted" for the purpose of generating a particular wave form of the local oscillation signal. Consequently, the transconductance per power dissipation is increased in the harmonic rejection mixer. Also, the noise disadvantages associated with cancelling current signals are eliminated by the harmonic rejection mixer with a shared differential transconductor. When working with cancelling currents, the uncorrelated noise components associated with these currents do generally not cancel out. Accordingly, these noise components contribute to the overall noise, whereas no useful signal component is contributed by the cancelling currents. Accordingly, the achievable signal-to-noise ratio of the harmonic rejection mixer according to an embodiment of the first aspect of the disclosure is also increased as compared to previous approaches.

According to a second aspect of the disclosure, a mixing stage of a harmonic rejection mixer is provided, which includes a differential in-phase signal path output terminal and a differential quadrature signal path output terminal, a shared differential transconductor for generating a shared transconductor output signal from a mixer input signal, a first selective mixing circuit coupled between the differential quadrature signal path output terminal and the shared differential transconductor, and a second selective mixing circuit coupled between the differential in-phase signal path output terminal and the shared differential transconductor, wherein the first selective mixing circuit is controlled by a first selective control signal and the second selective mixing circuit is controlled by a second selective control signal to selectively supply the shared transconductor output signal to the differential quadrature signal path output terminal and the differential in-phase signal path output terminal, respectively.

The same advantages as with the harmonic rejection mixer of the first aspect of the disclosure may be achieved with the mixing stage of a harmonic rejection mixer of the second aspect of the disclosure, as the mixing stage output signals have been generated in an analogously advantageous manner in terms of transconductance per power dissipation and exhibit the analogously advantageous signal to noise ratios.

In accordance with another aspect of the present disclosure, a circuit is provided that includes an input to receive an input signal; a shared differential transconductor coupled to the input and having an output; first and second selective mixing circuits, each having an input coupled to the output of the shared differential transconductor and each having an output; first and second fixed destination path differential transconductors, each coupled to the input and each having an output; first and second full wavelength mixing circuits, each having an input coupled to the first and second fixed destination path differential transconductors, respectively, and each having an output; a first adder circuit having first and second inputs coupled to the outputs of the first selective mixing circuit and first fixed destination path differential transconductor, respectively; a second adder circuit having first and second inputs coupled to the outputs of the second selective mixing circuit and second fixed destination path differential transconductor, respectively; and an image rejection circuit coupled to outputs of the first and second adder circuits.

In accordance with another aspect of the foregoing circuit, wherein the first selective mixing circuit, first full wavelength mixing circuit, and first adder comprise a quadrature signal path; and the second selective mixing circuit, second full wavelength mixing circuit, and second adder circuit comprise an in-phase signal path, the circuit further comprising a control circuit coupled to the first and second selective mixing circuits and first and second full wavelength mixing circuits to generate a first selective control signal to the first selective mixing circuit and a second selective control signal to the second selective mixing circuit.

BRIEF DESCRIPTION OF THE SEVERAL VIEWS OF THE DRAWINGS

Embodiments of the disclosure are described in greater detail below with reference to the Figures, wherein.

Figure 1:
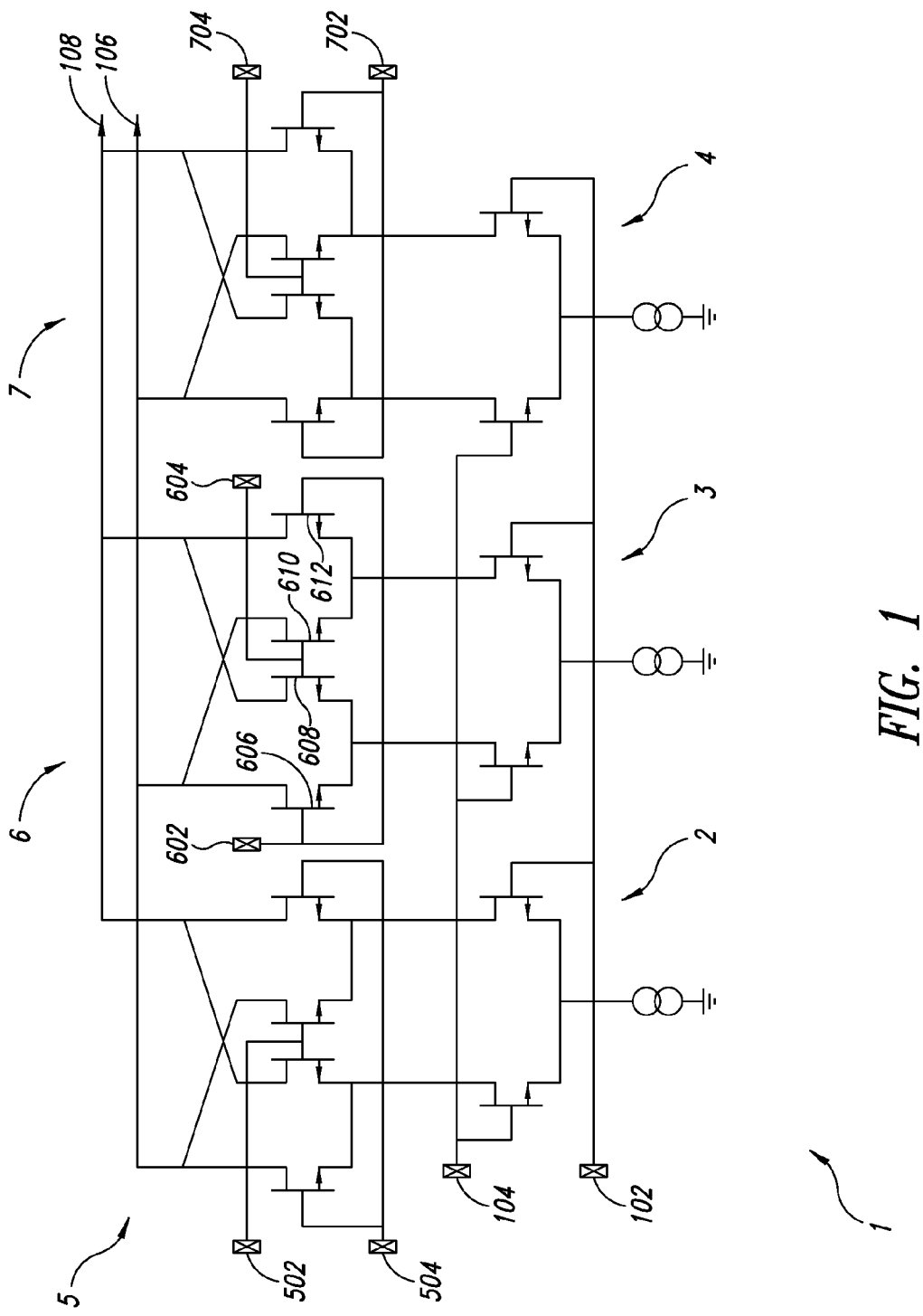
FIG. 1 shows a schematic diagram of a previous approach harmonic rejection mixer.

According elements are denoted with according reference numerals throughout the Figures.

DETAILED DESCRIPTION

Figure 2:
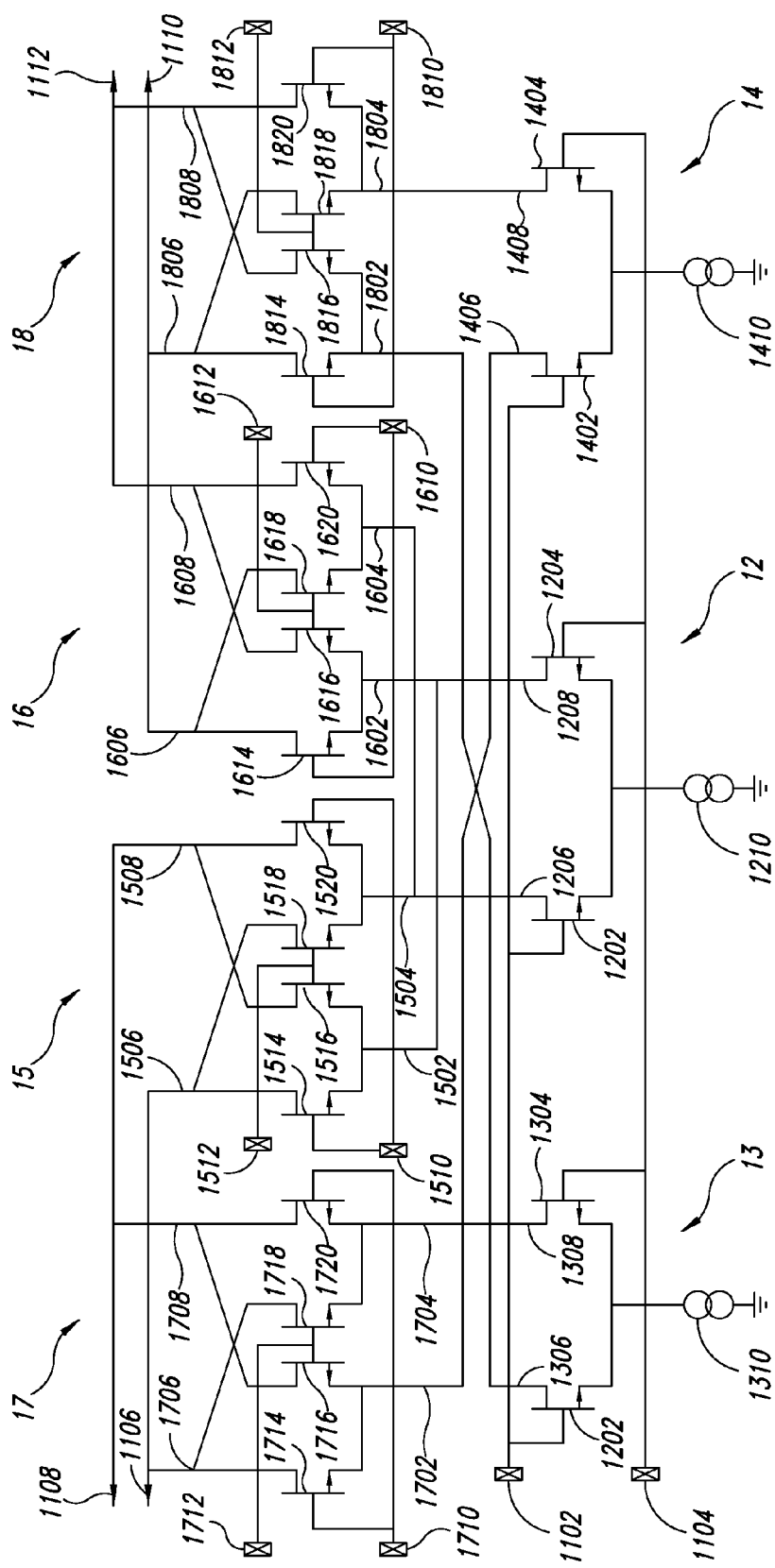
FIG. 2 shows a schematic diagram of a mixing stage of a harmonic rejection mixer according to an exemplary embodiment of the disclosure.

FIG. 2 shows a schematic circuit representation of an exemplary embodiment of a mixing stage 11 of a harmonic rejection mixer in accordance with an aspect of the disclosure. Herein, the term mixing stage refers to a combination of a transconducting sub-stage and a mixing operation sub-stage in the current domain. Accordingly, a differential mixer input voltage is converted to the current domain, wherein the mixing operation takes place. The mixing stage 11 has two input terminals 1102 and 1104, which are also the input terminals to the mixer as a whole. The mixing stage 11 is a complex mixing stage, i.e., it includes an in-phase signal path portion and a quadrature signal path portion. The quadrature signal path portion has two mixing stage output terminals 1106 and 1108, and the in-phase signal path portion has two mixing stage output terminal 1110 and 1112.

The mixing stage 11 includes a shared differential transconductor 12, a first fixed destination path differential transconductor 13, and a second fixed destination path differential transconductor 14. The shared differential transconductor 12 is comprised of two MOSFETS 1202 and 1204, whose control terminals, i.e., the gate terminals, are coupled to the input terminals 1102 and 1104 of the mixer. The controlled paths to the transistors 1202 and 1204 connect the first shared transconductor output terminal 1206 and the second shared transconductor output terminal 1208 to the bias current source 1210, respectively. The first and second fixed destination path differential transconductors 13 and 14 have the same circuit structure as the shared differential transconductor 12, respectively. With respect to the first fixed destination path differential transconductor 13, the gate terminals of the transistors 1302 and 1304 are coupled to the mixer input terminals 1102 and 1104, respectively. The first and the second fixed destination path transconductor output terminal 1306 and 1308 are coupled to the current bias source 1310 of the first fixed destination path differential transconductor 13 via the MOSFET channels of the transistors 1302 and 1304, respectively. With regard to the second fixed destination path differential transconductor 14, the gate terminals of the transistors 1402 and 1404 are coupled to the mixer input terminals 1102 and 1104, respectively. The third and fourth fixed destination path transconductor output terminals 1406 and 1408 are coupled to the current bias source 1410 of the second fixed destination path differential transconductor 14 via the MOSFET channels of the transistors 1402 and 1404, respectively.

The mixing stage 11 further includes a first selective mixing circuit 15, a second selective mixing circuit 16, a first full wavelength mixing circuit 17, and a second full wavelength mixing circuit 18. The first selective mixing circuit 15 and the first full wavelength mixing circuit 17 are disposed in the quadrature signal path portion, whereas the second selective mixing circuit 16 and the second full wavelength mixing circuit 19 are disposed in the in-phase signal path portion. Each of these mixing circuits is structured analogously to the mixing circuits shown in FIG. 1, with the circuit structure and operation of the mixing circuit 6 of FIG. 1 being described above. Hence, an in-depth discussion of an individual mixing circuit, which is also referred to as a switching quartet or Gilbert mixer and is known to a person skilled in the art, is omitted for brevity.

The four transistors 1514, 1516, 1518 and 1520 of the first selective mixing circuit are controlled by a first selective control signal supplied to the control terminals 1510 and 1512. Accordingly, the first selective mixing circuit output signal, present at the first and second selective mixing circuit output terminals 1506 and 1508, is the result of the multiplication of the first selective control signal with the first selective mixing circuit input signal, present at the first and second selective mixing circuit input terminals 1502 and 1504.

The four transistors 1614, 1616, 1618 and 1620 of the second selective mixing circuit are controlled by a second selective control signal supplied to the control terminals 1610 and 1612. Accordingly, the second selective mixing circuit output signal, present at the third and fourth selective mixing circuit output terminals 1606 and 1608, is the result of the multiplication of the second selective control signal with the second selective mixing circuit input signal, present at the third and fourth selective mixing circuit input terminals 1602 and 1604.

The four transistors 1714, 1716, 1718 and 1720 of the first full wavelength mixing circuit are controlled by a first full wavelength control signal supplied to the control terminals 1710 and 1712. Accordingly, the first full wavelength mixing circuit output signal, present at the first and second full wavelength mixing circuit output terminals 1706 and 1708, is the result of the multiplication of the first full wavelength control signal with the first full wavelength mixing circuit input signal, present at the first and second full wavelength mixing circuit input terminals 1702 and 1704.

The four transistors 1814, 1816, 1818 and 1820 of the second full wavelength mixing circuit are controlled by a second full wavelength control signal supplied to the control terminals 1810 and 1812. Accordingly, the second full wavelength mixing circuit output signal, present at the third and fourth full wavelength mixing circuit output terminals 1806 and 1808, is the result of the multiplication of the second full wavelength control signal with the second full wavelength mixing circuit input signal, present at the third and fourth full wavelength mixing circuit input terminals 1802 and 1804.

The connection between the transconducting sub-stage, which includes the differential transconductors 12, 13 and 14, and the mixing operation sub-stage, which includes the mixing circuits 15, 16, 17 and 18, is as follows: The first shared transconductor output terminal 1206 is coupled to the second selective mixing circuit input terminal 1504 and to the fourth selective mixing circuit input terminal 1604. The second shared transconductor output terminal 1208 is coupled to the first selective mixing circuit input terminal 1502 and to the third selective mixing circuit input terminal 1602. The first fixed destination path transconductor output terminal 1306 is coupled to the third full wavelength mixing circuit input terminal 1802. The second fixed destination path transconductor output terminal 1308 is coupled to the second full wavelength mixing circuit input terminal 1704. The third fixed destination path transconductor output terminal 1406 is coupled to the first full wavelength mixing circuit input terminal 1702. The fourth fixed destination path transconductor output terminal 1404 is coupled to the fourth full wavelength mixing circuit input terminal 1804.

It is apparent from the description of the structure of the mixer stage 11 above why the transconductors 13 and 14 are referred to as fixed destination path differential transconductors. Each one of the four outputs of the transconductors 13 and 14 is coupled to only one mixing circuit input terminal. Hence, the current leaving one of these transconductor output terminals is always supplied to either the in-phase signal path or the quadrature signal path. In contrast thereto, the first and second shared transconductor output terminals are both coupled to one mixing circuit input terminal in the in-phase signal path and one mixing circuit input terminal in the quadrature signal path. Hence, the term shared differential transconductor is used for the transconductor 12. The term selective mixing circuit is used, because the control of the first selective mixing circuit 15 and the second selective mixing circuit 16 determines, at what points in time the current from the shared differential transconductor 12 is supplied to the in-phase signal path and to the quadrature signal path, as will be described in detail below. The first and second full wavelength mixing circuits 17 and 18 supply the respectively received current throughout the full cycles of the local oscillation signals to the in-phase signal path and the quadrature signal path, respectively. Hence, they are referred to as full wavelength mixing circuits.

The operation of the mixing stage 11 depicted in FIG. 2 is described as follows. For the sake of illustration, one cycle of the local oscillation signals, i.e., the signals controlling the mixing circuits, is described. As is apparent to the person skilled in the art, an arbitrary number of these cycles may be subsequent to each other, such that continuous signal processing takes place in the mixing stage 11. The first selective control signal, supplied to the control terminals 1510 and 1512, the second selective control signal, supplied to the control terminals 1610 and 1612, the first full wavelength control signal, supplied to the control terminals 1710 and 1712, and the second full wavelength control signal, supplied to the control terminal 1810 and 1812, are all periodic with the same local oscillation frequency $f_{LO}$. Hence, from an initial point in time $t_0$, it is sufficient to look at one cycle of these four control signals to describe the full functionality of the mixing stage 11, since these control signals do not shift with respect to each other over time. Also for the sake of an easier understanding, this one cycle under consideration is referred to as being a function over the angle $\phi$, with $\phi$ ranging from 0° to 360°. This view of periodic signals is common in the art and will be easily understandable to a person skilled in the art.

The signal supplied to the terminal 1712 is the fundamental square wave signal, as defined above, i.e., a signal that is at a logical "1" state for the first half of the wavelength, i.e., between 0° and 180°, and at a logical "0" state for the second half of the wavelength, i.e., between 180° and 360°. In terms of time passed, the wavelength is $1/f_{LO}$. The signal supplied to the control terminal 1710 is the fundamental square wave signal shifted by 180°, i.e., a signal that is at a logical "0" state for the first half of the wavelength and at a logical "1" state for the second half of the wavelength. Accordingly, the transistors 1716 and 1718 are conductive between 0° and 180°, whereas the transistors 1714 and 1720 are conducted between 180° and 360°. Hence, the differential signal between the control terminals 1712 and 1710 can be written as sgn(sin($\phi$)). As the sin-function is commonly associated with quadrature signal paths, the signal path to the upper left hand side of FIG. 1, i.e., the signal path portion ending in the first and second mixing stage output terminals 1106 and 1108, is referred to as belonging to the quadrature signal path. Complementary thereto, the signal path to the upper right hand side of FIG. 2, i.e., the signal path portion ending in the mixing stage output terminals 1110 and 1112 is referred to as belonging to the in-phase signal path. Accordingly, the control signal supplied to the control terminal 1812 puts the transistors 1816 and 1818 in a conducting state between 90° and 270°. The transistors 1814 and 1820 are put into a conducting state between 0° and 90° as well as between 270° and 360°. This is achieved by supplying the fundamental square wave signal shifted by 90° to the control terminal 1812 and by supplying the fundamental square wave signal shifted by 270° to the control terminal 1810.

In the first selective mixing circuit 15, the transistors 1514 and 1520 are made conductive between 45° and 135°. The transistors 1516 and 1518 are made conductive between 225° and 31.5°. Accordingly, only 50% of the time, a transistor pair is made conductive in the first selective mixing circuit 15. That also means that only 50% of the time the output current from the shared differential transconductor 12 is supplied to the quadrature signal path. Analogously, the transistors 1614 and 1620 of the second selective mixing circuit 16 are made conductive between 135° and 225°. The transistors 1616 and 1618 are made conductive between 0° and 45° as well as between 315° and 360°. Accordingly, the output current from the shared differential transconductor is supplied to the in-phase signal path at only 50% of the time as well. As is apparent from the conducting state times given above for the eight transistors in the first selective mixing circuit 15 and the second selective circuit 16, only one transistor pair is conducting at any given moment in time. Accordingly, the whole current generated by the shared differential transconductor 12 is used for further processing in the mixing stage 11, but it is evenly distributed between the in-phase signal path and the quadrature signal path on a time average basis. The effect that the output current from the shared differential transconductor is never shared between the in-phase signal path and the quadrature signal path at any given moment in time, but is always supplied to either one of the two at a particular point in time, is achieved via orthogonal first and second selective control signals. Orthogonality is a property of two signals whose product is 0. Applied to the present first and second selective mixing circuits, this means that, whenever the first selective control signal, supplied to the control terminals 1510 and 1512, puts any transistors in a conducting state, i.e., whenever the second differential control signal is +1 or −1, the second selective control signal supplied to the control terminals 1610 and 1612 is 0. In addition to this orthogonality, the first and second selective control signals as described above allow for a complete usage of the output current from the shared differential transconductor, as there is no point during the wavelength where the output current from the shared differential transconductor is not supplied to either of the first and second selective mixing circuits.

It is moreover apparent from above description of the relationships between the first selective control signal and the first full wavelength control signal as well as between the second selective control signal and the second full wavelength control signal that, at no point in time, currents are supplied to either the in-phase signal path or the quadrature signal path, respectively, that cancel each other out. Hence, the total current produced in the transconducting sub-stage is used for the mixing stage output signals. Hence, the achieved transconductance per power used, i.e., per power dissipation, is optimal.

The first and second fixed destination path differential transconductors have a first transconductance value $g_m$. The shared differential transconductor has a second transconductance value $\sqrt{2}*g_m$. With these transconductance values and above established behavior of the mixer circuit control signals, the mixing stage output signal at the output terminals 1106 and 1108 of the quadrature signal path behaves as follows: $u_{in,1}*g_m$ between 0° and 45°, $(\sqrt{2}+1)*u_{in,1}*g_m$ between 45° and 135°, $u_{in,1}*g_m$ between 135° and 180°, $(-1)*u_{in,1}*g_m$ between 180° and 225°, $-(\sqrt{2}+1)*u_{in,1}*g_m$ between 225° and 315°, and $(-1)*u_{in,1}*g_m$ between 315° and 360°. This is a four-times oversampled sin-function after a sample and hold operation, multiplied by the mixer input signal and the transconductance $g_m$. Hence, harmonic rejection behavior identical—with the exception of scaling—to the previous approach mixer of FIG. 1 can be achieved. Analogously, the mixing stage output signal at the output terminals 1110 and 1112 of the in-phase signal path behaves like a four-times oversampled cos-function after a sample and hold operation, multiplied by the mixer input signal and the transconductance $g_m$.

Figure 3:
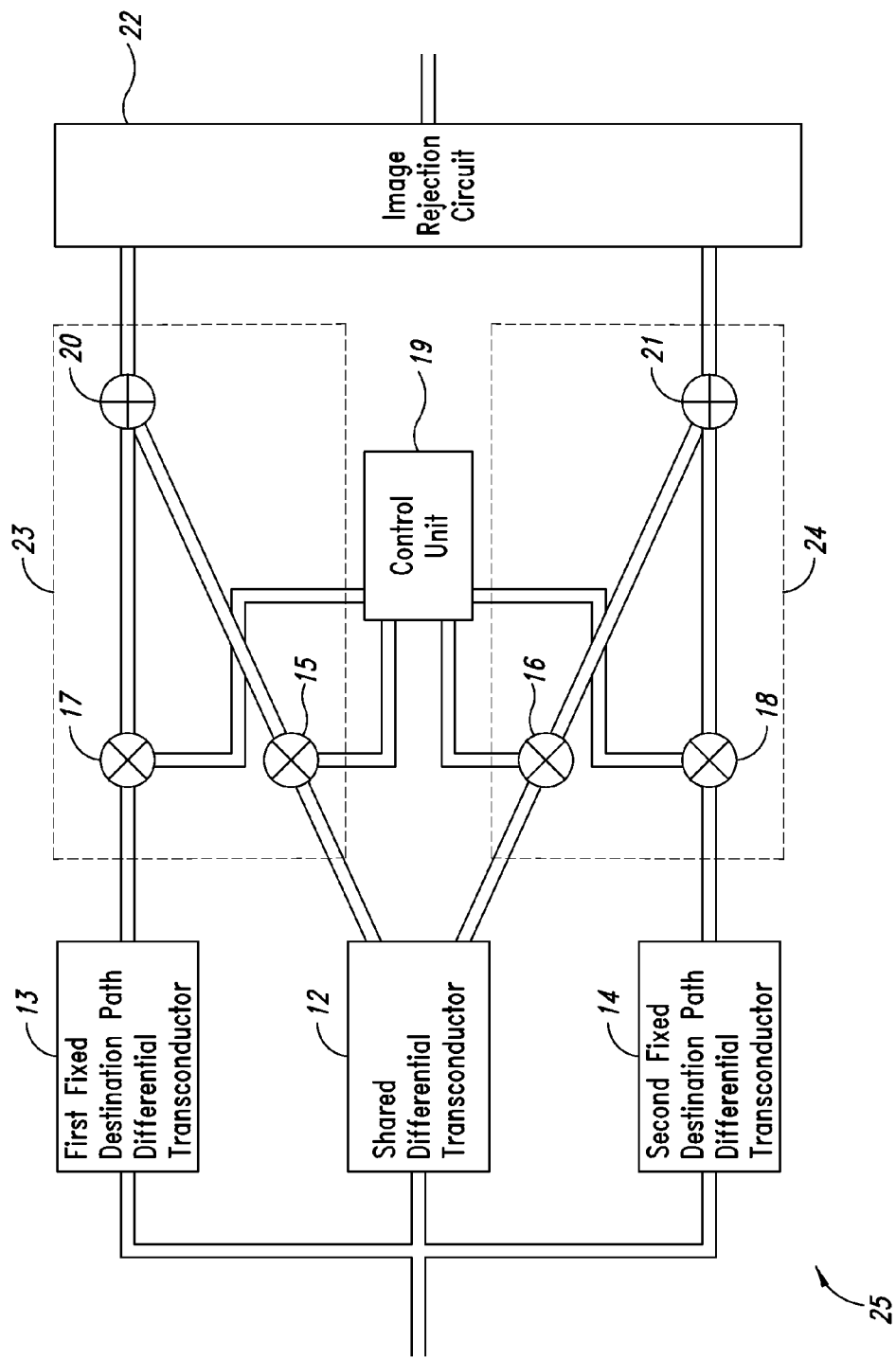
FIG. 3 shows a block diagram of a harmonic rejection mixer according to an exemplary embodiment of the disclosure.

The further processing of these signals is described with respect to FIG. 3, which depicts a block diagram of a harmonic rejection mixer 25 illustrating the signal flow therein. The harmonic rejection mixer 25 includes the shared differential transconductor 12, the first fixed destination path differential transconductor 13, the second fixed destination path differential transconductor 14, the first selective mixing circuit 15, the second selective mixing circuit 16, the first full wavelength mixing circuit 17, and the second full wavelength mixing circuit 18. These elements are connected as described above with respect to FIG. 2 (with the exception of the cross-coupling between fixed destination path differential transconductors and full wavelength mixing circuits not being implemented in FIG. 3). The output signals of the first selective mixing circuit 15 and the first full wavelength mixing circuit 17 are combined in the first adder 20. This addition corresponds to the joining of the output lines of the first selective mixing circuit 15 and the first full wavelength mixing circuit 17 in FIG. 2. The first selective mixing circuit 15, the first full wavelength circuit 15 and the first adder 20 are disposed in the quadrature signal path 23. The output signals of the second selective mixing circuit 16 and the second full wavelength mixing circuit 18 are combined in the second adder 21. This addition corresponds to the joining of the output lines of the second selective mixing circuit 16 and the second full wavelength mixing circuit 18 in FIG. 2. The second selective mixing circuit 16, the second full wavelength circuit 18 and the second adder 21 are disposed in the in-phase signal path 24. The control unit 19 generates the first and second selective control signals and the first and second full wavelength control signals supplied to the first and second selective mixing circuit and the first and second full wavelengths mixing circuit, respectively.

The outputs of the first and second adders 20 and 21 are combined in the image rejection circuit 22. Image rejection circuits are known in the art and are configured to filter out undesired image frequency components of the radio frequency signal that are translated into the same intermediate frequency band by the mixing circuits as the desired radio frequency components.

Accordingly, the harmonic rejection mixer structure, described with respect to the FIGS. 2 and 3, allows for image rejection and harmonic rejection on the basis of 4-time oversampled sin- and cos-signals, wherein only three transconductors and four mixing circuits are needed. A complex image rejection mixer on the basis of the previous approach mixer technology of FIG. 1 would involve two of the mixers shown in FIG. 1, one for the in-phase signal path and one for the quadrature signal path. Hence, six transconductors and six mixing circuits would be needed to implement an image rejection mixer with the technology of FIG. 1. Accordingly, a significant reduction in devices can be reached, which allows for a simpler and more cost efficient implementation. Moreover, less electronic noise sources are placed in the signal path.

Moreover, no current components are canceled in the mixer architecture with a shared differential transconductor, whereas, in the previous approach of FIG. 1, current components are canceled in order to generate the 4-times oversampled sin-wave form. This allows for a 3 dB increase in conversion transconductance at the same power dissipation and total transconductance of the transconducting sub-stage, as compared to the previous approach. Viewed the other way around, for a desired transconductance gain of the mixing stage, significantly less power has to be provided, as the power dissipation through cancelling currents is eliminated.

Although the above described embodiment of the harmonic rejection mixer in accordance with an aspect of the disclosure features 4-time oversampled sin- and cos-signals as total mixing signals, it is pointed out that other implementations are also within the scope of the disclosure. Having only the shared differential transconductor and no fixed destination path differential transconductors would allow to provide two-time oversampled sin- and cos-signals as the total mixing signals in the quadrature and in-phase signal paths, respectively. Also, an inclusion of further shared differential transconductor(s) and/or further fixed destination path differential transconductors as well as of according mixing circuits allows for generating N-time oversampled sin- and cos-signals as the total mixing signals, with N being higher than 4.

The cross-coupling between the first and second fixed destination path differential transconductors and the first and second full wavelength mixing circuits, as shown in FIG. 2, is advantageous in terms of the reduced noise introduced in the signal paths. The intrinsic noise generated in the first and second fixed destination path differential transconductors is generally not correlated. Due to the cross-coupling, the noise components of the first full wavelength mixing circuit input signal and the second full wavelength mixing circuit input signal are made correlated. Hence, one of the two side bands of these noise components is canceled out by the image rejection circuit, wherein the two side bands refer to the noise portion at the desired radio frequency and the noise portion at the undesired image frequency, both of which being translated to the intermediate frequency through the mixing operation. Due to this noise component cancelling and the increased conversion transconductance, the noise figure of this structure is significantly improved. A further benefit of this structure is that a degradation of the image rejection due to mismatch of the transconductors is avoided. However, it is pointed out that the cross-coupling is not a limiting feature of the disclosure. FIG. 3 shows an embodiment without cross-coupling.

Moreover, the present disclosure is not intended to be limited to particular implementations of the differential transconductors and the mixing circuits. Even though the exemplary embodiment has been shown to comprise MOSFETs, any other kinds of suitable signal processing and switching devices with and without resistive and inductive degeneration, such as bipolar transistors may be used. Also, the MOSFETs used may be p-channel or n-channel MOSFETs. The necessary adjustments of the design due to these device choices are apparent to a person skilled in the art.

In a further embodiment of the disclosure, the first selective control signal and the second selective control signal are orthogonal. This ensures that the shared transconductor output signal is only applied to the in-phase signal path or the quadrature phase signal path at any given time, which makes the mixer behavior well-behaved, predictable and highly accurate. Also, an addition of the absolute values of the first selective control signal and the second selective control signal may yield a constant value signal. This allows for operating the shared differential transconductor with a fixed transconductance and always using the total current produced by the shared differential transconductor, which is beneficial in terms of power efficiency. Moreover, the first and second selective control signals may be in quadrature. In this way, these signals allow for a distribution of the shared differential transconductor output current, which is beneficial for generating in-phase and quadrature signal path signals that allows for a high quality image rejection.

In a further embodiment the first selective control signal is a two-time oversampled sin-signal and the second selective control signal is a two-time oversampled cos-signal.

In yet another embodiment, the harmonic rejection mixer includes a first fixed destination path differential transconductor for receiving the mixer input signal, a second fixed destination path differential transconductor for receiving the mixer input signal, a first full wavelength mixing circuit disposed in the differential quadrature signal path for mixing a first full wavelength mixing circuit input signal with a first full wavelength control signal, and a second full wavelength mixing circuit disposed in the differential in-phase signal path for mixing a second full wavelength mixing circuit input signal with a second full wavelength control signal, with the second full wavelength control signal being in quadrature with the first full wavelength control signal, wherein the first and second fixed destination path differential transconductors are coupled to the first and second full wavelength mixing circuits. This structure allows for achieving a mixing operation with 4-time oversampled sin- and cos-signals at low circuit complexity and excellent power efficiency.

Therein, the first fixed destination path differential transconductor may be coupled to the first full wavelength mixing circuit and the second fixed destination path differential transconductor may be coupled to the second full wavelength mixing circuit, which allows for a highly integratable circuit structure, in which short signal paths can be ensured throughout the mixer. Alternatively, the first and second fixed destination path differential transconductors and the first and second full wavelength mixing circuits are cross-coupled. This allows for a cancelling of essentially 50% of the noise power introduced by the first and second fixed destination path differential transconductors and mixed to the desired mixer output frequency, with the cancelling being achieved through the image reject combination of the in-phase signal and the quadrature signal by the image reject circuit. In order to achieve this cross-coupling, the first fixed destination path differential transconductor may have a first transconductor output terminal and a second transconductor output terminal, the second fixed destination path differential transconductor may have a third transconductor output terminal and a fourth transconductor output terminal, the first full wavelength mixing circuit may have a first mixing circuit input terminal and a second mixing circuit input terminal, and the second full wavelength mixing circuit may have a third mixing circuit input terminal and a fourth mixing circuit input terminal, wherein the first transconductor output terminal may be coupled to the third mixing circuit input terminal, the second transconductor output terminal may be coupled to the second mixing circuit input terminal, the third transconductor output terminal may be coupled to the first mixing circuit input terminal, and the fourth transconductor output terminal may be coupled to the fourth mixing circuit input terminal.

In a further embodiment, the first and second fixed destination path differential transconductors have a first transconductance value, respectively, and the shared differential transconductor has a second transconductance value, with the second transconductance value being the first transconductance value multiplied by $\sqrt{2}$. This ratio of the first and second transconductance values allows for an accurate implementation of sampled and held sin- and cos-signals.

In yet another embodiment, the sum of the first full wavelength control signal multiplied with the first transconductance value and the first selective control signal multiplied with the second transconductance value is a four-time oversampled sin-signal, and the sum of the second full wavelength control signal multiplied with the first transconductance value and the second selective control signal multiplied with the second transconductance value is a four-time oversampled cos-signal. With this condition, the transconductance values of the transconductors and the control signals for the mixing circuits may be chosen, such that the 3rd, 5th, 11th, 13th, 19th, 21st, etc. harmonic of the local oscillation frequency $f_{LO}$ are suppressed, while high power efficiency and noise rejection is achieved.

The harmonic rejection mixer may also comprise an image rejection circuit coupled to the differential in-phase signal path and to the differential quadrature signal path for generating a mixer output signal.

Furthermore, the features and advantages described with respect to the harmonic rejection mixer are equally applicable to the mixing stage of the harmonic rejection mixer in accordance with the second aspect of the present disclosure.

While the disclosure has been described with reference to exemplary embodiments, it will be understood by those skilled in the art that various changes may be made and equivalents may be substituted for elements thereof without departing from the scope of the disclosure. In addition, many modifications may be made to adapt to a particular situation or material to the teachings of the disclosure without departing from the essential scope thereof. Therefore it is intended that the disclosure not be limited to the particular embodiments disclosed, but that the disclosure will include all embodiments falling within the scope of the independent claims.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A harmonic rejection mixer, comprising:
   a differential quadrature circuit having a first selective mixing circuit configured to receive a first selective control signal and to generate a first output signal;
   a differential in-phase circuit having a second selective mixing circuit configured to receive a second selective control signal and to generate a second output signal; and
   a shared differential transconductor circuit configured to receive a mixer input signal and the first and second output signals and to generate a shared transconductor output signal, the shared differential transconductor circuit configured to selectively supply the shared transconductor output signal to the first selective mixing circuit and the second selective mixing circuit, respectively, in response to the first and second output signals from the first and second selective mixing circuits.

2. The harmonic rejection mixer of claim 1, comprising a control signal generation unit configured to generate the first and second selective control signals, the control signal generation unit coupled to the first selective mixing circuit and the second selective mixing circuit.

3. The harmonic rejection mixer of claim 2 wherein the control signal generation unit is configured to generate the first selective control signal and the second selective control signal to be orthogonal with respect to one another.

4. The harmonic rejection mixer of claim 2 wherein the control signal generation unit is configured to generate the first and second selective control signals to be in quadrature.

5. A harmonic rejection mixer, comprising:
- a shared differential transconductor configured to generate a shared transconductor output signal from a mixer input signal;
- a first fixed destination path differential transconductor configured to receive the mixer input signal;
- a second fixed destination path differential transconductor configured to receive the mixer input signal;
- a differential quadrature circuit coupled to the first fixed destination path differential transconductor and having a first full wavelength mixing circuit configured to receive and mix a first full wavelength mixing circuit input signal with a first full wavelength control signal, the differential quadrature circuit further including a first selective mixing circuit coupled to the shared differential transconductor;
- a differential in-phase circuit coupled to the second fixed destination path differential transconductor and having a second full wavelength mixing circuit coupled to the shared differential transconductor circuit and configured to receive and mix a second full wavelength mixing circuit input signal with a second full wavelength control signal, with the second full wavelength control signal being in quadrature with the first full wavelength control signal, the differential in-phase circuit further including a second selective mixing circuit coupled to the shared differential transconductor.

6. The harmonic rejection mixer of claim 5 wherein the first fixed destination path differential transconductor is coupled to the first full wavelength mixing circuit and the second fixed destination path differential transconductor is coupled to the second full wavelength mixing circuit.

7. The harmonic rejection mixer of claim 5 wherein the first and second fixed destination path differential transconductors and the first and second full wavelength mixing circuits are cross-coupled.

8. The harmonic rejection mixer of claim 5 wherein:
- the first fixed destination path differential transconductor has a first transconductor output terminal and a second transconductor output terminal,
- the second fixed destination path differential transconductor has a third transconductor output terminal and a fourth transconductor output terminal,
- the first full wavelength mixing circuit has a first mixing circuit input terminal and a second mixing circuit input terminal, and
- the second full wavelength mixing circuit has a third mixing circuit input terminal and a fourth mixing circuit input terminal,
- wherein the first transconductor output terminal is coupled to the third mixing circuit input terminal, the second transconductor output terminal is coupled to the second mixing circuit input terminal, the third transconductor output terminal is coupled to the first mixing circuit input terminal, and the fourth transconductor output terminal is coupled to the fourth mixing circuit input terminal.

9. The harmonic rejection mixer of claim 5 wherein:
- the first and second fixed destination path differential transconductors are configured to have a first transconductance value, respectively, and
- the shared differential transconductor is configured to have a second transconductance value that is the first transconductance value multiplied by $\sqrt{2}$.

10. The harmonic rejection mixer of claim 5, comprising an image rejection circuit coupled to the differential in-phase signal path and to the differential quadrature signal path and configured to generate a mixer output signal.

11. A system, comprising:
- a harmonic rejection mixer that includes:
  - a differential quadrature circuit having a first selective mixing circuit configured to receive a first selective control signal and to generate a first output signal;
  - a differential in-phase circuit having a second selective mixing circuit configured to receive a second selective control signal and to generate a second output signal; and
  - a shared differential transconductor circuit configured to receive a mixer 1 input signal and the first and second output signals and to generate a shared transconductor output signal, the shared differential transconductor circuit coupled to the differential in-phase circuit and the differential quadrature circuit and configured to selectively supply the shared transconductor output signal to the first and second selective mixing circuits, respectively, in response to the first and second output signals from the first and second selective mixing circuits.

12. The system of claim 11, further comprising:
- a first fixed destination path differential transconductor circuit configured to receive the mixer input signal;
- a second fixed destination path differential transconductor circuit configured to receive the mixer input signal;
- the differential quadrature circuit having a first full wavelength mixing circuit configured to receive and mix a first full wavelength mixing circuit input signal with a first full wavelength control signal, the differential quadrature circuit further including the first selective mixing circuit that is coupled to the shared differential transconductor circuit; and
- the differential in-phase circuit having a second full wavelength mixing circuit configured to receive and mix a second full wavelength mixing circuit input signal with a second full wavelength control signal, with the second full wavelength control signal being in quadrature with the first full wavelength control signal, the differential in-phase circuit further including the second selective mixing circuit that is coupled to the shared differential transconductor circuit.

13. The system of claim 12 wherein:
- the first and second fixed destination path differential transconductor circuits have a first transconductance value, respectively,
- the shared differential transconductor circuit has a second transconductance value that is the first transconductance value multiplied by $\sqrt{2}$.

14. A harmonic rejection mixer, comprising:
- a shared differential transconductor circuit configured to receive a mixer input signal and to generate a shared transconductor output signal from the mixer input signal;
- a first selective mixing circuit coupled to the shared differential transconductor;
- a second selective mixing circuit coupled to the shared differential transconductor;
- a first fixed destination path differential transconductor circuit configured to receive the mixer input signal;
- a second fixed destination path differential transconductor circuit configured to receive the mixer input signal;

a first full wavelength mixing circuit coupled to the first selective mixing circuit and the first fixed destination path differential transconductor circuit;

a second full wavelength mixing circuit coupled to the second selective mixing circuit and the second fixed destination path differential transconductor circuit; and a control signal generation unit configured to generate, a first full wavelength control signal to control the first full wavelength mixing circuit; a second full wavelength control signal to control the second full wavelength mixing circuit the second full wavelength control signal being in quadrature with the first full wavelength control signal; a first selective control signal to control the first selective mixing circuit; and a second selective control signal to control the second selective mixing circuit to selectively supply the shared transconductor output signal to the first full wavelength mixing circuit and the second full wavelength mixing circuit, respectively.

15. The harmonic rejection mixer of claim 14 wherein the control signal generation unit is configured to generate the first selective control signal and the second selective control signal to be orthogonal with respect to one another.

16. The harmonic rejection mixer of claim 14 wherein the control signal generation unit is configured to generate the first and second selective control signals to be in quadrature.

17. A circuit, comprising:
a shared differential transconductor circuit configured to receive an input signal;
first and second selective mixing circuits, each coupled to the shared differential transconductor circuit;
first and second fixed destination path differential transconductor circuits configured to receive the input signal;
first and second full wavelength mixing circuits, each coupled to the first and second fixed destination path differential transconductors, respectively, and selectively coupled to the shared differential transconductor circuit by the first and second selective mixing circuits;
a first adder circuit coupled to the first selective mixing circuit and the first fixed destination path differential transconductor circuit, respectively;
a second adder circuit coupled to the second selective mixing circuit and the second fixed destination path differential transconductor circuit, respectively; and
an image rejection circuit coupled to the first and second adder circuits.

18. The circuit of claim 17 wherein the first selective mixing circuit, first full wavelength mixing circuit, and first adder comprise a quadrature signal path; and the second selective mixing circuit, second full wavelength mixing circuit, and second adder circuit comprise an in-phase signal path, the circuit further comprising a control circuit coupled to the first and second selective mixing circuits and configured to generate a first selective control signal to the first selective mixing circuit and a second selective control signal to the second selective mixing circuit.

19. The circuit of claim 18 wherein the control circuit is configured to generate the first selective control signal and the second selective control signal to be orthogonal with respect to one another.

20. The circuit of claim 18 wherein the control circuit is configured to generate the first and second selective control signals to be in quadrature.

21. The circuit of claim 18 wherein the control circuit is configured to generate the first selective control signal as a two-time oversampled sin-signal and the second selective control signal as a two-time oversampled cos-signal.

22. The circuit of claim 18 wherein:
the first and second fixed destination path differential transconductors are configured to have a first transconductance value, respectively, and
the shared differential transconductor is configured to have a second transconductance value that is the first transconductance value multiplied by $\sqrt{2}$.

\* \* \* \* \*